US008354817B2

(12) United States Patent
Yeh et al.

(10) Patent No.: US 8,354,817 B2
(45) Date of Patent: Jan. 15, 2013

(54) METHODS AND SYSTEMS FOR DIAGNOSING STATOR WINDINGS IN AN ELECTRIC MOTOR

(75) Inventors: Chia-Chou Yeh, Lomita, CA (US); Steven E. Schulz, Torrance, CA (US); Mohammad N. Anwar, Van Buren Township, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 668 days.

(21) Appl. No.: 12/486,910

(22) Filed: Jun. 18, 2009

(65) Prior Publication Data

US 2010/0320953 A1    Dec. 23, 2010

(51) Int. Cl.
*H02P 23/00* (2006.01)
(52) U.S. Cl. ......... 318/812; 318/490; 318/727; 318/767
(58) Field of Classification Search .................. 318/490, 318/727, 767, 812
See application file for complete search history.

(56) References Cited

U.S. PATENT DOCUMENTS

| | | | | |
|---|---|---|---|---|
| 6,069,467 | A * | 5/2000 | Jansen ........................... | 318/802 |
| 6,236,947 | B1 * | 5/2001 | Dowling et al. ................ | 702/38 |
| 6,308,140 | B1 * | 10/2001 | Dowling et al. ................ | 702/60 |
| 6,462,491 | B1 * | 10/2002 | Iijima et al. .............. | 318/400.34 |
| 6,566,830 | B2 | 5/2003 | Walters | |
| 6,611,771 | B1 * | 8/2003 | Habetler et al. ................ | 702/58 |
| 6,636,823 | B1 * | 10/2003 | Unsworth et al. ............ | 702/115 |
| 6,737,833 | B2 | 5/2004 | Kalman et al. | |
| 6,741,060 | B2 | 5/2004 | Krefta et al. | |
| 6,828,752 | B2 | 12/2004 | Nakatsugawa et al. | |
| 6,838,844 | B2 | 1/2005 | Shimizu et al. | |
| 6,838,848 | B2 | 1/2005 | Shindo | |
| 7,075,260 | B2 | 7/2006 | Maeda | |
| 7,116,068 | B2 | 10/2006 | Boesch et al. | |
| 7,116,077 | B2 | 10/2006 | Raftari et al. | |
| 7,151,354 | B2 | 12/2006 | Yoshinaga et al. | |
| 7,176,652 | B2 | 2/2007 | Wakabayashi et al. | |
| 7,243,006 | B2 | 7/2007 | Richards | |
| 7,286,906 | B2 | 10/2007 | Richards | |
| 7,474,067 | B2 | 1/2009 | Ueda et al. | |
| 7,577,545 | B2 | 8/2009 | Hu | |
| 7,671,552 | B2 | 3/2010 | Tonami et al. | |
| 7,768,220 | B2 * | 8/2010 | Schulz et al. ................. | 318/432 |
| 8,044,678 | B2 | 10/2011 | Kao et al. | |
| 8,253,365 | B2 | 8/2012 | Yeh | |
| 2002/0145837 | A1 | 10/2002 | Krefta et al. | |

(Continued)

OTHER PUBLICATIONS

Yeh, C-C., "Methods and Systems for Performing Fault Diagnostics for Rotors of Electric Motors," U.S. Appl. No. 12/582,456, filed Oct. 20, 2009.

(Continued)

*Primary Examiner* — Kawing Chan
(74) *Attorney, Agent, or Firm* — Ingrassia Fisher & Lorenz, P.C.

(57) ABSTRACT

Systems and methods are provided for diagnosing stator windings in an electric motor operating under control of a current-regulating control loop. The current-regulating control loop is configured to provide a command voltage to the electric motor. The command voltage comprises a current-regulated voltage based on a difference between a commanded current and a measured current through the stator windings. The method comprises determining a negative sequence component of the command voltage, and identifying a fault condition when a characteristic of the negative sequence component is greater than a threshold value.

18 Claims, 2 Drawing Sheets

U.S. PATENT DOCUMENTS

| | | | |
|---|---|---|---|
| 2002/0172509 A1* | 11/2002 | Kameya et al. | 388/800 |
| 2003/0034751 A1 | 2/2003 | Walters | |
| 2003/0062868 A1 | 4/2003 | Mir et al. | |
| 2003/0086222 A1* | 5/2003 | Stoupis et al. | 361/62 |
| 2003/0107339 A1 | 6/2003 | Shimizu et al. | |
| 2003/0193310 A1 | 10/2003 | Raftari et al. | |
| 2003/0227271 A1 | 12/2003 | Shindo | |
| 2004/0103719 A1 | 6/2004 | Raftari et al. | |
| 2004/0109267 A1* | 6/2004 | Habetler | 361/23 |
| 2004/0134267 A1 | 7/2004 | Boesch et al. | |
| 2004/0169482 A1 | 9/2004 | Maeda | |
| 2005/0029972 A1* | 2/2005 | Imai et al. | 318/254 |
| 2005/0073280 A1 | 4/2005 | Yoshinaga et al. | |
| 2006/0138992 A1* | 6/2006 | Yamamoto | 318/727 |
| 2006/0192512 A1 | 8/2006 | Maeda | |
| 2006/0192513 A1 | 8/2006 | Maeda | |
| 2006/0192516 A1 | 8/2006 | Maeda | |
| 2007/0052381 A1 | 3/2007 | Ueda et al. | |
| 2007/0069682 A1* | 3/2007 | Ide et al. | 318/719 |
| 2008/0300820 A1 | 12/2008 | Hu | |
| 2009/0021194 A1 | 1/2009 | Tonamai et al. | |
| 2009/0189561 A1 | 7/2009 | Patel et al. | |
| 2009/0261770 A1 | 10/2009 | Fujishiro et al. | |
| 2009/0261774 A1 | 10/2009 | Yuuki et al. | |
| 2010/0169030 A1* | 7/2010 | Parlos | 702/58 |
| 2010/0295491 A1* | 11/2010 | Schulz et al. | 318/490 |

OTHER PUBLICATIONS

Yeh, C-C., "Methods and Systems for Diagnosing Faults for Rotors of Electric Motors," U.S. Appl. No. 12/854,772, filed Aug. 11, 2010.

Schulz, S.E., et al., "Methods and Systems for Diagnosing Stator Windings in an Electric Motor," U.S. Appl. No. 12/468,362, filed May 19, 2009.

Notice of Allowance dated Apr. 22, 2010, issued in U.S. Appl. No. 12/108,868.

Chapman, P.L., et al. "Optimal Current Control Strategies for Surface-Mounted Permanent-Magnet Synchronous Machine Drives," IEEE Transactions on Energy Conversion, Dec. 1999, pp. 1043-1050, vol. 14, No. 4.

Choi, J-W., et al. "Novel Periodic Torque Ripple Compensation Scheme in Vector Controlled AC Motor Drives," IEEE Applied Power Electronics Conference and Exposition, Feb. 1998, pp. 81-85, vol. 1.

Favre, E. et al. "Permanent-Magnet Synchronous Motors: a Comprehensive Approach to Cogging Torque Suppression," IEEE Transactions on Industry Applications, Nov./Dec. 1993, pp. 1141-1149, vol. 29, No. 6.

Hung, J.Y. et al. "Minimization of Torque Ripple in Permanent Magnet Motors: a Closed Form Solution," IEEE Power Electronics and Motion Control, 1992, pp. 459-463, vol. 1.

Le-Huy, H., et al. "Minimization of Torque Ripple in Brushless DC Motor Drives," IEEE Transactions on Industry Applications, Jul./Aug. 1986, pp. 748-755, vol. IA-22, No. 4.

Kang, C. et al. "An Efficient Torque Control Algorithm for BLDCM with a General Shape of Back EMF," 24th Annual IEEE Power Electronics Specialist Conference, 1993, pp. 451-457.

Lee, S. et al. "A Harmonic Reference Frame Based Current Controller for Active Filter," IEEE School of Electrical Engineering, 2000, pp. 1073-1078.

Lu, C.W. et al. "Novel Approach to Current Profiling for AC Permanent Magnet Motors," IEEE Transactions on Energy Conversion, Dec. 1999, pp. 1294-1299, vol. 14, No. 4.

Wu, A.P. et al. "Cancellation of Torque Ripple Due to Nonidealities of Permanent Magnet Synchronous Machine Drives," IEEE Power Electronics Specialist Conference, 2003, pp. 256-261, vol. 1.

Benbouzid, M. E-H., "A Review of Inductions Motors Signature Analysis as a Medium for Faults Detection," IEEE Transactions on Industrial Electronics, Oct. 2000, pp. 984-993, vol. 47, No. 5.

Bellini, A., et al., "Quantitative Evaluation of Induction Motor Broken Bars by Means of Electrical Signature Analysis," IEEE Transactions on Industry Applications, Sep./Oct. 2001, pp. 1248-1255, vol. 37, No. 5.

Douglas, H. et al., "Broken Rotor Bar Detection in Induction Machines With Transient Operating Speeds," IEEE Transactions on Energy Conversion, Mar. 2005, pp. 135-141, vol. 20, No. 1.

Yazici, B. et al., "An Adaptive Statistical Time-Frequency Method for Detection of Broken Bars and Bearing Faults in Motors Using Stator Current," IEEE Transactions on Industry Applications, Mar./Apr. 1999, pp. 442-452, vol. 35, No. 2.

Kia, S.H. et al., "A High-Resolution Frequency Estimation Method for Three-Phase Induction Machine Fault Detection," IEEE Transactions on Industrial Electronics, Aug. 2007, pp. 2305-2314, vol. 54, No. 4.

Rajagopalan, S. et al., "Detection of Rotor Faults in Brushless DC Motors Operating Under Nonstationary Conditions," IEEE Transactions on Industry Applications, Nov./Dec. 2006, pp. 1464-1477, vol. 42, No. 6.

Blodt, M. et al., "On-Line Monitoring of Mechanical Faults in Variable-Speed Induction Motor Drives Using the Wigner Distribution," IEEE Transactions on Industrial Electronics, Feb. 2008, pp. 522-533, vol. 55, No. 2.

Douglas, H. et al., "A New Algorithm for Transient Motor Current Signature Analysis Using Wavelets," IEEE Transactions on Industry Applications, Sep./Oct. 2004, pp. 1361-1368, vol. 40, No. 5.

Cusido, J. et al., "Fault Detection in Inductions Machines Using Power Spectral Density in Wavelet Decomposition," IEEE Transactions on Industrial Electronics, Feb. 2008, pp. 633-643, vol. 55, No. 2.

Cruz, S.M.A. et al., "Diagnosis of Stator, Rotor and Airgap Eccentricity Faults in Three-Phase Induction Motors Based on the Multiple Reference Frames Theory," IEEE Industry Applications Conference, Oct. 2003, pp. 1340-1346, vol. 2.

Filippetti, F. et al., "AI Techniques in Induction Machines Diagnosis Including the Speed Ripple Effect," IEEE Transactions on Industry Applications, Jan./Feb. 1998, vol. 34, No. 1.

U.S. Utility Office Action for U.S. Appl. No. 12/468,362 mailed Mar. 7, 2011.

"Report of Large Motor Reliability Survey of Industrial and Commercial Installations, Part I," IEEE Transactions on Industry Applications, Jul. 1985, pp. 853-864, vol. IA-21, No. 4.

"Report of Large Motor Reliability Survey of Industrial and Commercial Installations, Part II," IEEE Transactions on Industry Applications, Jul. 1985, pp. 865-872, vol. IA-21, No. 4.

Albrecht, P.F. et al., "Assessment of the Reliability of Motors in Utility Applications—Updated," IEEE Transactions on Energy Conversions, Mar. 1986, pp. 39-46, vol. EC-1, No. 1.

Bonnett, A. H. et al., "Cause and analysis of stator and rotor failures in three-phase squirrel-cage induction motors," IEEE Transactions on Industry Applications, Jul./Aug. 1992, pp. 921-937, vol. 28, No. 4.

Kilman, G.B. et al., "A new approach to on-line turn fault detection in AC motors," IEEE Transactions on Industry Applications, 1996, pp. 687-693, vol. 1, San Diego, CA, USA.

Kohler, J.L. et al., "Alternatives for assessing the electrical integrity of induction motors," IEEE Transactions on Industry Applications, Sep./Oct. 1992, pp. 1109-1117, vol. 28, No. 5.

Siddique, A. et al., "Applications of artificial intelligence techniques for induction machine stator fault diagnostics: review," IEEE International Symposium on Diagnostics for Electric Machines, Power Electronics and Drives, Aug. 2003, pp. 29-34, vol./No. 24-26.

Khan, M.A.S.K. et al., "Real-Time Implementation of Wavelet Packet Transform-Based Diagnosis and Protection of Three-Phase Induction Motors," IEEE Transactions on Energy Conversions, Sep. 2007, pp. 647-655, vol. 22, No. 3.

Briz, F. et al., "Online stator winding fault diagnosis in inverter-fed AC machines using high-frequency signal injection," IEEE Transactions on Industry Applications Conference, Jul./Aug. 2003, pp. 1109-1117, vol. 39, No. 4.

Trutt, F.C. et al., "Detection of AC machine winding deterioration using electricallyexcited vibrations," IEEE Transactions on Industry Applications, Jan./Feb. 2001, pp. 10-14, vol. 37, No. 1.

Mirafzal, B. et al., "Interturn Fault Diagnosis in Induction Motors Using the Pendulous Oscillation Phenomenon," IEEE Transactions on Energy Conversions, Dec. 2006, pp. 871-882, vol. 21, No. 4.

Penman, J. et al., "Detection and location of interturn short circuits in the stator windings of operating motors," IEEE Transactions on Energy Conversions, Dec. 1994, pp. 652-658, vol. 9, No. 4.

Briz, F. et al., "Induction machine diagnostics using zero sequence components," IEEE Transactions on Industry Applications Conference, 2005, Oct. 2005, pp. 34-41, vol. 1, No. 2-6.

Cruz, S. M. A. et al., "Stator winding fault diagnosis in three-phase synchronous and asynchronous motors, by the extended park's vector approach," IEEE Transactions on Industry Applications Conference, 2000, Sep./Oct. 2001, pp. 1227-1233, vol. 37, No. 5.

Cruz, S. M. A. et al., "DSP implementation of the multiple reference frames theory for the diagnosis of stator faults in a DTC induction motor drive," IEEE Transactions on Energy Conversion, Jun. 2005, pp. 329-335, vol. 20, No. 2.

Grubic, S. et al. "A survey on testing and monitoring methods for stator insulation systems of low-voltage induction machines focusing on turn insulation problems," IEEE Transactions on Industrial Electronics, Dec. 2008, pp. 4127-4136, vol. 55, No. 12.

Schulz, S.E. et al. "Harmonic Torque Ripple Reduction at Low Motor Speeds," U.S. Appl. No. 12/108,868, filed Apr. 24, 2008.

Notice of Allowance dated Feb. 1, 2012, issued in U.S. Appl. No. 12/582,456.

Notice of Allowance dated Aug. 15, 2011, issued in U.S. Appl. No. 12/468,362.

USPTO, U.S. Notice of Allowance dated May 4, 2012 for U.S. Appl. No. 12/582,456.

U.S. Office Action, dated Nov. 16, 2012, for U.S. Appl. No. 12/854,772.

* cited by examiner

METHODS AND SYSTEMS FOR DIAGNOSING STATOR WINDINGS IN AN ELECTRIC MOTOR

TECHNICAL FIELD

Embodiments of the subject matter described herein relate generally to electrical systems in automotive vehicles, and more particularly, embodiments of the subject matter relate to systems and methods for diagnosing a fault condition in stator windings of an electric motor.

BACKGROUND

In recent years, advances in technology, as well as ever evolving tastes in style, have led to substantial changes in the design of automobiles. Electric motors (or electric machines) are finding an increasing number of applications in the automotive industry due to the electrification of the automotive drive system. Electric and/or hybrid vehicles utilize electric motors as either primary or supplemental torque sources in the automotive drive system. These electric motors are expected to function over extreme operating conditions for an extended period of time with high reliability. However, over time, the operating stresses applied to the electric motor may degrade the condition of the stator windings. For example, thermal stress and/or voltage stress may lead to insulation breakdown, which in turn, may result in partial short-circuiting and/or open-circuiting of individual turns of the stator windings. When motors are fed from pulse-width modulated (PWM) inverter drives, the high-frequency switching of the power semiconductors increases the voltage stress on the stator windings.

Some prior art techniques attempt to diagnose the stator winding inter-turn faults by computing the negative sequence component of the motor currents which is caused by a fault condition in the stator windings. However, field-oriented control (FOC) and other closed-loop current-regulated control techniques widely employed in electric and/or hybrid vehicles preserve symmetrical and balanced current waveforms in the electric motors. Therefore, even when a fault condition exists in the stator windings, there is no negative sequence component present in the motor currents because the motor currents are adjusted to remain balanced and symmetrical. Some other prior art techniques involve extensive computations, for example, Fast-Fourier series analysis, which are often inadequate for non-stationary transient motor operating conditions where torque and speed are constantly changing. In addition, an incipient fault condition in the stator windings can rapidly increase in severity, and thus, the computational delays impair the ability to identify and respond to an incipient fault condition within a limited amount of time.

BRIEF SUMMARY

In accordance with one embodiment, an apparatus for an electrical system in a vehicle is provided. The electrical system comprises an electric motor having stator windings, an energy source, and an inverter module coupled between the energy source and the stator windings. The inverter module is configured to provide a commanded voltage from the energy source to the stator windings of the electric motor. A plurality of current sensors are coupled between the inverter module and the stator windings and configured to measure currents through the stator windings, resulting in measured currents. A control module is coupled to the inverter module and the plurality of current sensors. The control module is configured to obtain a current command corresponding to a commanded current for the stator windings of the electric motor, generate a voltage command corresponding to the commanded voltage based on a difference between the measured current and the commanded current, determine a negative sequence component of the voltages for the stator windings based on the voltage command, and identify a fault condition in the stator windings based on the negative sequence voltage component.

In accordance with another embodiment, a method is provided for diagnosing stator windings in an electric motor. The method comprises generating a voltage command configured to regulate currents through the stator windings to a commanded value, and determining a negative sequence voltage component based on the voltage command. The method further comprises identifying a fault condition based on the negative sequence voltage component.

In another embodiment, a method is provided for diagnosing stator windings in an electric motor operating under control of a current-regulating control loop. The current-regulating control loop is configured to provide a command voltage to the electric motor. The command voltage comprises a current-regulated voltage based on a difference between a commanded current and a measured current through the stator windings. The method comprises determining a negative sequence component of the command voltage, and identifying a fault condition when a characteristic of the negative sequence component is greater than a threshold value.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
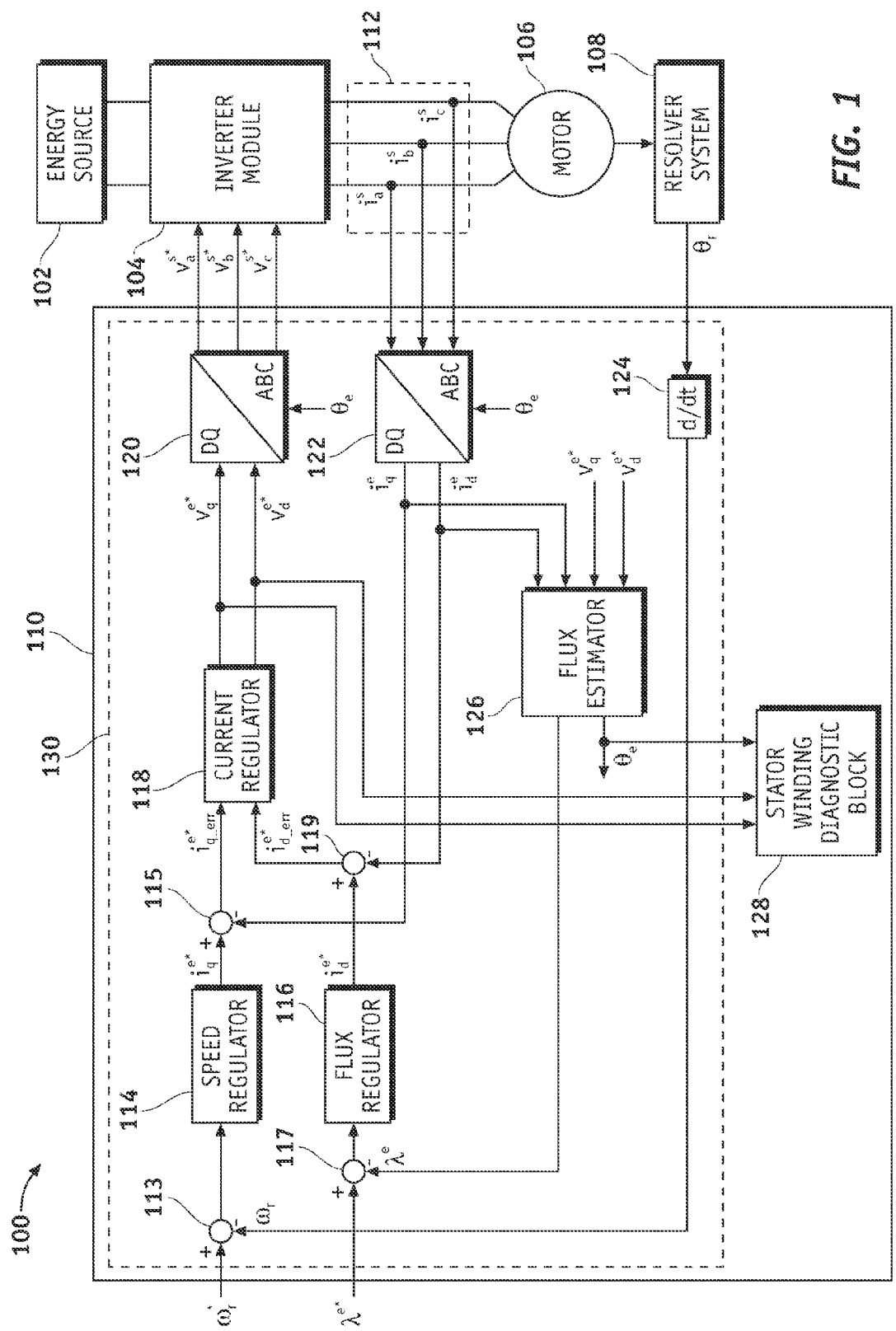
FIG. 1 is a block diagram of an electrical system suitable for use in a vehicle in accordance with one embodiment.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Techniques and technologies may be described herein in terms of functional and/or logical block components, and with reference to symbolic representations of operations, processing tasks, and functions that may be performed by various computing components or devices. It should be appreciated that the various block components shown in the figures may be realized by any number of hardware, software, and/or firmware components configured to perform the specified functions. For example, an embodiment of a system or a component may employ various integrated circuit components, e.g., memory elements, digital signal processing elements, logic elements, look-up tables, or the like, which may carry out a variety of functions under the control of one or more microprocessors or other control devices.

The following description refers to elements or nodes or features being "connected" or "coupled" together. As used herein, unless expressly stated otherwise, "connected" means that one element/node/feature is directly joined to (or directly communicates with) another element/node/feature, and not necessarily mechanically. Likewise, unless expressly stated otherwise, "coupled" means that one element/node/feature is directly or indirectly joined to (or directly or indirectly communicates with) another element/node/feature, and not necessarily mechanically. Thus, although the figures may depict one exemplary arrangement of elements, additional intervening elements, devices, features, or components may be present in an embodiment of the depicted subject matter. In addition, certain terminology may also be used in the following description for the purpose of reference only, and thus is not intended to be limiting. The terms "first", "second" and other such numerical terms referring to structures do not imply a sequence or order unless clearly indicated by the context.

For the sake of brevity, conventional techniques related to electric motor construction and/or operation, signaling, sensing, pulse-width modulation (PWM), and other functional aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter.

Technologies and concepts discussed herein relate generally to methods and systems for diagnosing a fault condition in the stator windings of an electric motor operating under control of a current-regulating control loop. A negative sequence component for the electric motor is identified based on the current-regulated command voltage being applied to the stator windings. The negative sequence component is then analyzed and a determination is made as to whether the negative sequence component is attributable to a fault condition in the stator windings. An incipient fault condition may be identified in a limited amount a time, thereby mitigating the effects of the fault condition on the electric motor. As used herein, the meaning of subscription and superscription is as follows:

Subscript d and q: Quantity in the d-q frame. The d-q frame of reference, in Cartesian coordinates, is synchronous with the rotation of a characteristic of a rotor (e.g. the rotor flux angle) within the electric motor.

Superscript s: Quantity in the stator windings of the electric motor in the stationary reference frame.

Superscript e: Quantity in the rotating (synchronous) reference frame.

Superscript *: Quantity which is commanded.

FIG. 1 depicts an exemplary embodiment of an electrical system 100 suitable for use in a vehicle. The electrical system 100 includes, without limitation, an energy source 102, an inverter module 104, an electric motor 106, a resolver system 108, a control module 110, and a plurality of current sensors 112. In an exemplary embodiment, the control module 110 generates voltage command corresponding to a voltage to be applied from the energy source 102 to the stator windings of the electric motor 106 via the inverter module 104. In this regard, the inverter module 104 and control module 110 are cooperatively configured to employ pulse-width modulation (PWM) techniques to modulate phase legs of the inverter module 104 and apply or otherwise provide the commanded voltage to the electric motor 106. It should be understood that FIG. 1 is a simplified representation of an electrical system 100 for purposes of explanation and is not intended to limit the scope or applicability of the subject matter described herein in any way. In this regard, although FIG. 1 depicts the control module 110 and the inverter module 104 as distinct and separate elements, in practice, the control module 110 may be integral with (or incorporated) in the inverter module 104.

In an exemplary embodiment, the inverter module 104 is coupled between the energy source 102 and the electric motor 106. In an exemplary embodiment, the current sensors 112 are coupled between the inverter module 104 and the electric motor 106 and configured to measure the currents flowing from the inverter module 104 through the stator windings of the electric motor 106, as described in greater detail below. The control module 110 is coupled to the current sensors 112 and obtains the measured currents through the stator windings of the electric motor 106 from the current sensors 112. The resolver system 108 is coupled between the electric motor 106 and the control module 110, and the resolver system 108 is suitably configured to measure, sense, or otherwise obtain the position of the rotor of the electric motor 106. As described in greater detail below, in an exemplary embodiment, the control module 110 is configured to regulate current through the stator windings to a commanded value by controlling the voltage provided from the energy source 102 to the electric motor 106. In an exemplary embodiment, the control module 110 is configured to identify a fault condition in the stator windings of the electric motor 106 based on the negative sequence component of the voltages being provided to the electric motor 106, as described in greater detail below.

In an exemplary embodiment the vehicle is realized as an automobile. In alternative embodiments, the vehicle may be any one of a number of different types of automobiles, such as, for example, a sedan, a wagon, a truck, or a sport utility vehicle (SUV), and may be two-wheel drive (2WD) (i.e., rear-wheel drive or front-wheel drive), four-wheel drive (4WD), or all-wheel drive (AWD). The vehicle may also incorporate any one of, or combination of, a number of different types of engines, such as, for example, a gasoline or diesel fueled combustion engine, a "flex fuel vehicle" (FFV) engine (i.e., using a mixture of gasoline and alcohol), a gaseous compound (e.g., hydrogen and natural gas) fueled engine, a combustion/electric motor hybrid engine, and an electric motor. In alternative embodiments, the vehicle may be a plug-in hybrid vehicle, a fully electric vehicle, a fuel cell vehicle (FCV), or another suitable alternative fuel vehicle.

In an exemplary embodiment, the energy source 102 (or power source) is capable of providing a direct current (DC) voltage to the inverter module 104 for operating the electric motor 106. Depending on the embodiment, the energy source 102 may be realized as a battery, a fuel cell, a rechargeable high-voltage battery pack, an ultracapacitor, or another suitable energy source known in the art.

In the illustrated embodiment of FIG. 1, the electric motor 106 is preferably realized as an induction motor, however, the subject matter described herein should not be construed as being limited to use with any particular type of electric motor. In other embodiments, the electric motor 106 may be realized as an internal permanent magnet (IPM) motor, a synchronous reluctance motor, or another suitable motor known in the art. In this regard, the electric motor 106 may be realized as a non-salient machine (e.g., an induction motor, permanent surface mount machine) having a spatial impedance that is independent of the rotor position or a salient machine (e.g., a synchronous reluctance motor, interior permanent magnet motor) having a spatial impedance that depends on the rotor position with respect to the stator windings, as will be appreciated in the art.

In an exemplary embodiment, the electric motor 106 is a three-phase alternating current (AC) electric machine having a rotor and stator windings (or coils). In an exemplary embodiment, for a three-phase motor, the stator windings are arranged in three sets of windings, wherein each set of windings corresponds to a phase of the electric motor 106. In this regard, each current sensor 112 is associated with a particular phase of the electric motor 106 and obtains the current for the respective phase of the electric motor 106 in a conventional manner. It should be understood that although the subject matter may be described herein in the context of a three-phase electric motor, the subject matter is not limited to three-phase machines and may be adapted for an electric motor having any number of phases or an electrical system having any number of current sensors.

In an exemplary embodiment, the inverter module 104 includes a power inverter configured to convert the DC power from the energy source 102 into AC power for driving the electric motor 106 in a conventional manner, as will be appreciated in the art. In this regard, the inverter module 104 includes one or more phase legs corresponding to the one or more phases of the electric motor 106, wherein switches of the phase leg are modulated (opened or closed) at a particular switching frequency to produce an AC voltage across the stator windings of the electric motor 106, which in turn creates torque-producing current in the stator windings and operates the electric motor 106, as will be appreciated in the art.

In an exemplary embodiment, the resolver system 108 comprises a resolver coupled to the electric motor 106, and the output of the resolver is coupled to a resolver-to-digital converter. The resolver (or similar sensing device) senses the position of the rotor ($\theta_r$) of the electric motor 106. The resolver-to-digital converter converts the signals from the resolver to digital signals (e.g., a digital rotor position signal) which are provided to the control module 110.

The control module 110 generally represents the hardware suitably configured to implement field-oriented control or current-regulated control of the electric motor 106 by controlling and/or operating the inverter module 104 to provide a commanded voltage from the energy source 102 to the electric motor 106. In this regard, the commanded voltage is a current-regulated voltage, that is, a voltage configured to regulate current in the stator windings of the electric motor 106 to a particular value, as described in greater detail below. Depending on the embodiment, the control module 110 may be implemented or realized with a general purpose processor, a content addressable memory, a digital signal processor, an application specific integrated circuit, a field programmable gate array, any suitable programmable logic device, discrete gate or transistor logic, discrete hardware components, or any combination thereof, designed to perform the functions described herein. In this regard, the control module 110 may be realized as a microprocessor, a controller, a microcontroller, a state machine, or the like. The control module 110 may also be implemented as a combination of computing devices, e.g., a combination of a digital signal processor and a microprocessor, a plurality of microprocessors, one or more microprocessors in conjunction with a digital signal processor core, or any other such configuration. In practice, the control module 110 includes processing logic that may be configured to carry out the functions, techniques, and processing tasks associated with the operation of the electrical system 100, as described in greater detail below. Furthermore, the steps of a method or algorithm described in connection with the embodiments disclosed herein may be embodied directly in hardware, in firmware, in a software module executed by the control module 110, or in any practical combination thereof.

In an exemplary embodiment, the control module 110 is implemented in the d-q synchronous reference frame, that is, the d-q axes of the reference frame rotate in lockstep with a reference characteristic of the rotor (e.g., the rotor position, the rotor flux angle) of the electric motor 106 such that rotation (or angular displacement) of the rotor characteristic produces a corresponding rotation (or angular displacement) of the d-q axes. In an exemplary embodiment, the control module 110 is implemented in the counterclockwise synchronous reference frame such that rotation of the rotor characteristic produces a corresponding counterclockwise rotation of the d-q axes. As shown in the illustrated embodiment of FIG. 1, in the case of an induction motor, the synchronous reference frame is preferably determined relative to the rotor flux angle ($\theta_e$).

In an exemplary embodiment, the control module 110 includes a speed regulator 114, a flux regulator 116, a current regulator 118, a first transformation block 120, a second transformation block 122, a speed calculator 124, a flux estimator 126, and a stator winding diagnostic block 128. The elements of the control module 110 are suitably configured to create a current-regulating control loop 130 (or alternatively, field-oriented control loop or current-controlled feedback loop), as described in greater detail below. In an exemplary embodiment, the stator winding diagnostic block 128 is configured to identify or detect the existence of a fault condition in the stator windings of the electric motor 106 based on the negative sequence component of the voltages applied to the stator windings of the electric motor 106, as described in greater detail below.

In the illustrated embodiment, the output of a first summing junction 113 is coupled to the input of the speed regulator 114, and the output of the speed regulator is coupled to a second summing junction 115. The output of a third summing junction 117 is coupled to the input of the flux regulator 116, and the output of the flux regulator 116 is coupled to a fourth summing junction 119. The output of the second summing junction 115 and the output of the fourth summing junction 119 are each coupled to the input of the current regulator 118. The outputs of the current regulator 118 are coupled to the first transformation block 120, and the outputs of the first transformation block 120 is coupled to the inverter module 104. The second transformation block 122 is coupled to the current sensors 112, and the individual outputs of the second transformation block 122 are coupled to the second summing junction 115 and the fourth summing junction 119, as described in greater detail below. In an exemplary embodiment, the inputs of the flux estimator 126 are coupled to the output of the second transformation block 122 and the output of the current regulator 118, as described in greater detail below. A first output of the flux estimator 126 is coupled to the third summing junction 117 and the second output of the flux estimator 126 is coupled to the transformation blocks 120, 122 and the stator winding diagnostic block 128. In an exemplary embodiment, the stator winding diagnostic block 128 is also coupled to the output of the current regulator 118, as described in greater detail below.

In an exemplary embodiment, the first summing junction 113 is configured to receive a speed command ($\omega^*_r$) that represents a desired speed (or commanded speed) for the rotor of the electric motor 106. The speed command may be provided by another module in the vehicle, such as, for example, an electronic control unit (ECU). The speed calculator 124 calculates or otherwise determines the observed (or measured) rotor speed ($\omega_r$) based on the change in rotor position ($\theta_r$) versus time, as will be appreciated in the art. The first summing junction 113 is configured to determine the difference between the speed command ($\omega^*_r$) and the observed rotor speed ($\omega_r$) and provide the difference to the speed regulator 114. Based on the difference between the speed command ($\omega^*_r$) and the rotor speed ($\omega_r$), the speed regulator 114 determines and/or generates a q-axis synchronous frame current command ($i_q^{e*}$) (e.g., the torque-producing q-axis current command). The speed regulator 114 may be realized as a proportional-integral (PI) controller or another suitable element known in the art.

In an exemplary embodiment, the third summing junction 117 is configured to receive a flux command ($\lambda^{e*}$) that represents a desired rotor flux for the electric motor 106. The flux command may be provided by another module in the vehicle, such as, for example, an electronic control unit (ECU). The flux estimator 126 calculates or otherwise estimates the rotor flux ($\lambda^e$) based on the relationship between the synchronous motor currents ($i_d^e$, $i_q^e$) and the synchronous motor voltages ($v_d^e$, $v_q^e$), as will be appreciated in the art and described in greater detail below. The third summing junction 117 is configured to determine the difference between the flux command ($\lambda^{e*}$) and the estimated rotor flux ($\lambda^e$) and provide the difference to the flux regulator 116. Based on the difference between the flux command and the estimated flux, the flux regulator 116 determines and/or generates a d-axis synchronous frame current command ($i_d^{e*}$) (e.g., the flux-producing d-axis current command). The flux regulator 116 may be realized as a proportional-integral (PI) controller or another suitable element known in the art.

In an exemplary embodiment, the flux estimator 126 also calculates or otherwise estimates rotor flux angle ($\theta_e$) for the rotor of the electric motor 106 based on the relationship between the synchronous motor current ($i_d^e$, $i_q^e$) and the synchronous motor voltage ($v_d^e$, $v_q^e$). In the illustrated embodiment of FIG. 1, the rotor flux angle ($\theta_e$) is utilized as a transformation angle for the control loop 130, as will be appreciated in the art. In this regard, the transformation angle represents the angle used when transforming and/or translating a quantity in the synchronous reference frame to a corresponding quantity in the stationary reference frame, and vice versa (e.g., a 'dqo' or 'dq0' to 'abc' transformation, and vice versa). In alternative embodiments, the transformation angle may comprise the angular rotor position ($\theta_r$) or another suitable angular position. The output of the flux estimator 126 is configured to provide the estimated rotor flux angle ($\theta_e$) to the first transformation blocks 120, 122. The second transformation block 122 is coupled to the current sensors 112 and configured to transform the measured stator currents from the stationary reference frame ($i_a^s$, $i_b^s$, $i_c^s$) to the synchronous reference frame ($i_d^e$, $i_q^e$) based on the transformation angle, i.e., the estimated rotor flux angle ($\theta_e$). In a similar manner, the first transformation block 120 is configured to transform a commanded voltage (or voltage command) from the synchronous reference frame ($v_d^{e*}$, $v_q^{e*}$) to the stationary reference frame ($v_a^{s*}$, $v_b^{s*}$, $v_c^{s*}$) based the estimated rotor flux angle ($\theta_e$), as described in greater detail below.

The current regulator 118 regulates the currents through the stator windings by generating and/or providing a voltage command for the inverter module 104 corresponding to a commanded voltage for the stator windings of the electric motor 106 such that the measured currents through the stator windings are regulated to or otherwise track the commanded motor current (or current command). In an exemplary embodiment, the current regulator 118 is realized as a synchronous frame current regulator configured to generate the voltage command in the synchronous reference frame ($v_d^{e*}$, $v_q^{e*}$) (alternatively referred to herein as the synchronous frame voltage commands) based on the difference between the commanded current ($i_d^{e*}$, $i_q^{e*}$) (alternatively referred to herein as the synchronous frame current command) and the measured motor current ($i_d^e$, $i_q^e$) (alternatively referred to herein as the synchronous frame motor current). In this regard, in accordance with one or more embodiments, the second summing junction 115 determines a q-axis current error command ($i_{q\_err}^{e*}$) based on a difference between the q-axis current command ($i_q^{e*}$) and the measured q-axis motor current ($i_q^e$) and the fourth summing junction 119 determines a d-axis current error command ($i_{d\_err}^{e*}$) based on a difference between the d-axis current command ($i_d^{e*}$) and the measured d-axis motor current ($i_d^e$). The current regulator 118 generates the synchronous frame voltage commands ($v_d^{e*}$, $v_q^{e*}$) based on the synchronous frame current error commands ($i_{d\_err}^{e*}$, $i_{q\_err}^{e*}$) which reflect the difference between the commanded current and the measured motor current expressed in the synchronous reference frame. In this regard, the current regulator 118 may be realized as a proportional-integral-derivative (PID) controller, a hysteresis current controller, a complex vector current regulator, or another suitable current-regulating element known in the art. It should be noted that current regulator 118 produces a substantially balanced and symmetrical currents in the electric motor 106. As a result, any negative sequence component that would normally be present in the measured motor currents in response to a fault condition in the stator windings (e.g., an imbalance in the impedance for the phases of the stator windings due to changes in the resistance and/or inductance of at least one of the phases of the stator windings relative to the other phases) will be reflected in the output of the current regulator 118 (e.g., in the voltage commands and/or motor phase voltages), as described in greater detail below.

As set forth above, the first transformation block 120 transforms the synchronous frame voltage commands ($v_d^{e*}$, $v_q^{e*}$) from the output of the current regulator 118 to the stationary reference frame, resulting in three-phase stationary voltage commands ($v_a^{s*}$, $v_b^{s*}$, $v_c^{s*}$) corresponding to commanded voltages for the respective phases of the stator windings of the electric motor 106. In an exemplary embodiment, the inverter module 104 is configured to process the stationary voltage commands and generate PWM command signals for operating the phase legs of the power inverter to provide the commanded voltages to the respective phases of the stator windings in a conventional manner, as will be appreciated in the art. In this manner, changes in the synchronous frame voltage commands ($v_d^{e*}$, $v_q^{e*}$) produce corresponding changes in stationary voltage commands, and thus, the duty cycles of the PWM commands used to modulate the switches of the inverter phase legs. In this regard, the synchronous frame voltage commands ($v_d^{e*}$, $v_q^{e*}$) may be used to estimate the rotor flux ($\lambda^e$) and transformation angle ($\theta_e$) (e.g., $v_d^{e*} \approx v_d^e$, $v_q^{e*} \approx v_q^e$), based on the assumption that the inverter module 104 is accurately reproducing the commanded voltages ($v_a^{s*}$, $v_b^{s*}$, $v_c^{s*}$) in the stator windings and in lieu of using voltage sensors to sense the voltage across the stator windings or performing other computationally intensive tasks to obtain the motor voltage.

Figure 2:
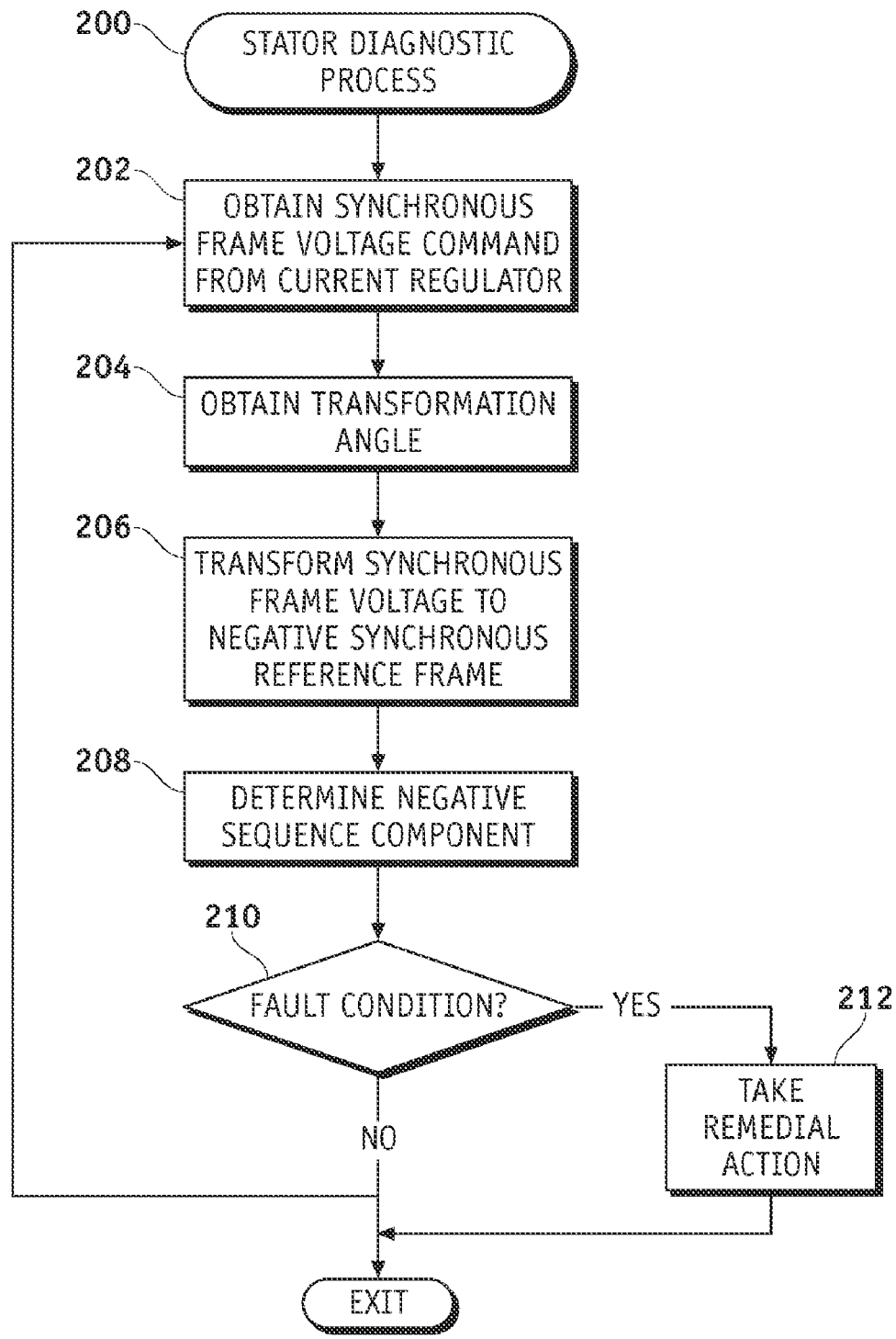
FIG. 2 is a flow diagram of an exemplary stator diagnostic process suitable for use with the electrical system of FIG. 1 in accordance with one embodiment.

Referring now to FIG. 2, in an exemplary embodiment, an electrical system may be configured to perform a stator diagnostic process 200 and additional tasks, functions, and operations described below. The various tasks may be performed by software, hardware, firmware, or any combination thereof. For illustrative purposes, the following description may refer to elements mentioned above in connection with FIG. 1. In practice, the tasks, functions, and operations may be performed by different elements of the described system, such as the inverter module 104, the control module 110, the current regulator 118, the flux estimator 126, and/or the stator winding diagnostic block 128. It should be appreciated any number of additional or alternative tasks may be included, and may be incorporated into a more comprehensive procedure or process having additional functionality not described in detail herein.

Referring again to FIG. 2, and with continued reference to FIG. 1, in an exemplary embodiment, the stator diagnostic process 200 is performed to diagnose the stator windings of an electric motor during operation of the electric motor under control of a current-regulating control loop. The stator diagnostic process 200 begins by obtaining the voltages across the stator windings (the motor voltages) of the electric motor from the output of a current regulator in the current-regulating control loop (task 202). In an exemplary embodiment, the stator diagnostic process 200 and/or stator winding diagnostic block 128 obtains the synchronous frame motor voltage by obtaining the synchronous frame voltage command ($v_d^{e*}$, $v_q^{e*}$) from the output of the current regulator 118. As set forth above, the voltage command ($v_d^{e*}$, $v_q^{e*}$) from the current regulator 118 is substantially equal to the actual synchronous frame voltage across the stator windings of the electric motor 106 (e.g., $v_d^{e*} \approx v_d^e$, $v_q^{e*} \approx v_q^e$) as long as the inverter module 104 is accurately producing the corresponding commanded voltages ($v_a^{s*}$, $v_b^{s*}$, $v_c^{s*}$) in the stator windings.

In an exemplary embodiment, the stator diagnostic process 200 continues by obtaining a transformation angle for converting the voltage command from the synchronous reference frame to the stationary reference frame (task 204). As set forth above, in the illustrated embodiment of FIG. 1, the transformation angle is realized as the estimated rotor flux angle ($\theta_e$), wherein the stator diagnostic process 200 and/or stator winding diagnostic block 128 may obtain the transformation angle ($\theta_e$) from the flux estimator 126. In alternative embodiments, the transformation angle may be based on another characteristic of the electric motor 106. For example, if the transformation angle is based on the rotor position ($\theta_r$), the control module 110 and/or stator winding diagnostic block 128 may obtain the rotor position ($\theta_r$) from the resolver system 108 and determine the transformation angle based on the rotor position ($\theta_r$).

In an exemplary embodiment, the stator diagnostic process 200 continues by transforming the synchronous frame motor voltage to the negative synchronous reference frame based on the obtained transformation angle, resulting in a negative synchronous frame motor voltage (task 206). In this regard, the negative synchronous reference frame rotates synchronously with the rotation of the reference characteristic of the rotor and in a direction opposite that of the synchronous reference frame (e.g., the positive sequence synchronous reference frame). For example, if the positive sequence synchronous reference frame is realized as a counterclockwise synchronous reference frame, then the negative sequence synchronous reference frame comprises a clockwise synchronous reference frame. In an exemplary embodiment, the synchronous frame voltage command ($v_d^{e*}$, $v_q^{e*}$) is expressed in the counterclockwise synchronous reference frame. The stator diagnostic process 200 and/or stator winding diagnostic block 128 transforms the voltage command from the counterclockwise (positive sequence) synchronous reference frame ($v_d^{e*}$, $v_q^{e*}$) to the stationary reference frame (e.g., $v_a^{s*}$, $v_b^{s*}$, $v_c^{s*}$) based on the transformation angle, and then utilizes the transformation angle again to transform the voltage command from the stationary reference frame to the negative sequence synchronous reference frame, resulting in a negative sequence synchronous frame motor voltage ($v_d^{-e}$, $v_q^{-e}$). In this regard, the negative sequence synchronous frame motor voltage may be calculated or otherwise determined based on the following equation $$\begin{bmatrix} v_q^{-e} \\ v_d^{-e} \end{bmatrix} = \begin{bmatrix} \cos(-2\theta) & -\sin(-2\theta) \\ \sin(-2\theta) & \cos(-2\theta) \end{bmatrix} \cdot \begin{bmatrix} v_q^{e*} \\ v_d^{e*} \end{bmatrix},$$

where $\theta$ represents the transformation angle (e.g., $\theta_e$ or $\theta_r$) for transformations from the stationary reference frame to the positive sequence synchronous reference frame.

In an exemplary embodiment, the stator diagnostic process 200 continues by determining the negative sequence component of the motor voltage (or alternatively, the negative sequence voltage component) based on the negative synchronous frame motor voltage (task 208). As set forth above, by virtue of the substantially balanced and symmetrical current-regulated control of the electric motor 106, any negative sequence current component introduced by a fault condition in the stator windings will be reflected in the voltage commands, which are responsive to the imbalances in the synchronous frame motor current ($i_d^e$, $i_q^e$) caused by the negative sequence component. In this regard, the negative sequence component of the motor voltage comprises a DC component of the negative synchronous frame motor voltage as well as AC harmonic components of the positive sequence voltage components. In this regard, the stator diagnostic process 200 and/or stator winding diagnostic block 128 determines the negative sequence component of the motor voltage by digitally filtering the negative synchronous frame motor voltage ($v_d^{-e}$, $v_q^{-e}$) and calculating the magnitude of the filtered negative synchronous frame motor voltage. In an exemplary embodiment, the negative synchronous frame motor voltage ($v_d^{-e}$, $v_q^{-e}$) is low-passed filtered to eliminate AC harmonic components of the positive sequence voltage and other noise and leave only the DC component (e.g., a component having zero or an otherwise imperceptibly low frequency). In this regard, the cutoff frequency of the digital filter should be less than the excitation (or fundamental) frequency of the motor currents.

In an exemplary embodiment, the stator diagnostic process 200 continues by identifying or otherwise determining whether a fault condition exists in the stator windings of the electric motor based on a characteristic of the negative sequence component of the motor voltage (task 210). In accordance with one embodiment, the stator diagnostic process 200 identifies a fault condition by comparing the magnitude of the negative sequence component to a threshold value and determining whether the magnitude of the negative sequence component is greater than the threshold value. The threshold value is chosen to be a negative sequence component magnitude that is indicative of a fault condition. In this regard, the threshold value is preferably large enough such that a negative sequence component that exceeds the threshold value is attributable to a fault condition (e.g., short-circuited and/or open-circuited stator winding turns) rather than noise, transients, component tolerances, or other circuit level effects, while at the same time, the threshold value is preferably small enough to detect incipient fault conditions. In other words, a magnitude of the negative sequence component exceeding the threshold magnitude is attributable to changes in the impedance of one or more phases of the stator windings relative to one or more other phases of the stator windings (e.g., changes in the resistance and/or inductance of the stator windings) and indicates the existence of a fault condition (or a likelihood of a fault condition). In accordance with one embodiment, the threshold value is approximately five percent of the magnitude of the total motor voltage (e.g., the magnitude of the synchronous frame voltage command).

In accordance with one embodiment, the stator diagnostic process 200 identifies a fault condition by calculating the rate of change of the magnitude of the negative sequence component and determining whether the rate of change is greater than a threshold rate of change. The threshold rate of change is chosen to be a value that is indicative of a fault condition, as described above. In this regard, stator diagnostic process 200 and/or stator winding diagnostic block 128 may calculate or otherwise determine the rate of change of the magnitude of the negative sequence component (e.g., the derivative of the negative sequence component) over a given time interval (e.g., on a sample by sample basis). Any rate of change of the magnitude of the negative sequence component that exceeds the threshold rate of change is attributable to a fault condition (e.g., short-circuited and/or open-circuited stator winding turns) rather than noise, transients, component tolerances, or other circuit level effects. In accordance with one embodiment, the threshold rate of change is approximately five Volts per second.

In an exemplary embodiment, if the stator diagnostic process 200 determines that a fault condition does not exist, the loop defined by tasks 202, 204, 206, 208 and 210 repeats as desired throughout operation of the electrical motor until a fault condition is identified. In this manner, the stator windings of the electric motor 106 may be constantly and/or continuously monitored (e.g., on a sample-by-sample basis or each time the control loop 130 updates). For example, for a control loop 130 operating with a 10 kHz sampling rate, the stator windings may be diagnosed at 0.1 millisecond intervals, thereby allowing an incipient fault condition to be identified (e.g., a fault condition may be identified within 0.1 milliseconds). In response to identifying a fault condition, the stator diagnostic process 200 continues by taking remedial actions and/or other measures to ensure safe and/or effective operation of the electrical system (task 212). In accordance with one embodiment, the stator diagnostic process 200 prevents further operation of the electric motor in response to identifying the fault condition. For example, the control module 110 may set all the switches of the inverter module 104 to an open state to prevent current to the stator windings. In another embodiment, the stator diagnostic process 200 may enable operation of the electric motor with reduced capabilities, for example, by modifying the control scheme to limit the current through the electric motor or by limiting the torque production and/or rotor speed. In addition, the stator diagnostic process 200 may be configured to take additional remedial measures, such as, for example, providing notification of a fault condition to an electronic control system or another component in the vehicle which causes an audible and/or visual warning to be generated in the vehicle. It should be appreciated that any number of remedial actions and various combinations thereof may be utilized in any practical embodiment.

To briefly summarize, one advantage of the system and/or method described above is that the stator windings of the electric motor may be constantly monitored, thereby allowing an incipient or early stage fault condition to be readily identified and mitigating the adverse effects of a fault condition. In addition, a fault condition may be detected and/or diagnosed even in the case of for non-stationary transient motor operating conditions, because identifying the fault condition does not rely on Fast-Fourier series or other computationally intensive techniques. In addition, additional sensors (which increase the cost and decrease the reliability of the overall motor diagnostic system) for measuring the motor voltage are avoided.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An electrical system for use in a vehicle, the electrical system comprising:
    an electric motor having stator windings;
    an energy source;
    an inverter module coupled between the energy source and the stator windings, the inverter module being configured to provide a commanded voltage from the energy source to the stator windings of the electric motor;
    a plurality of current sensors coupled between the inverter module and the stator windings, the plurality of current sensors being configured to measure current through the stator windings, resulting in measured current; and
    a control module coupled to the inverter module and the plurality of current sensors, the control module being configured to:
        obtain a current command corresponding to a commanded current for the stator windings of the electric motor;
        generate a voltage command corresponding to the commanded voltage based on a difference between the measured current and the commanded current;
        determine a negative sequence voltage for the stator windings based on the voltage command; and
        identify a fault condition in the stator windings based on a characteristic of a DC component of the negative sequence voltage.

2. The electrical system of claim 1, wherein the control module is configured to identify the fault condition in the stator windings when a magnitude of the DC component of the negative sequence voltage exceeds a threshold value.

3. The electrical system of claim 1, wherein the control module is configured to identify the fault condition when a rate of change of the DC component of the negative sequence voltage exceeds a threshold value.

4. The electrical system of claim 1, wherein the control module includes a current regulator configured to generate the voltage command based on the difference between the measured current and the commanded current such that the measured current is regulated to the commanded current.

5. The electrical system of claim 4, the current regulator comprising a synchronous frame current regulator configured to generate the voltage command in a counterclockwise synchronous reference frame, resulting in a synchronous frame voltage command.

6. The electrical system of claim 5, wherein the control module is configured to determine the negative sequence voltage by:
obtaining a transformation angle; and
transforming the synchronous frame voltage command to a clockwise synchronous reference frame based on the transformation angle.

7. The electrical system of claim 6, wherein the control module is configured to determine the transformation angle based on a relationship between the measured current and the voltage command.

8. The electrical system of claim 6, further comprising a resolver system coupled between the electric motor and the control module, the resolver system being configured to obtain a position of a rotor of the electric motor, wherein the control module is configured to determine the transformation angle based on the position of the rotor.

9. The electrical system of claim 4, the current regulator comprising a synchronous frame current regulator configured to generate a positive synchronous frame voltage command in a positive synchronous reference frame.

10. The electrical system of claim 9, wherein the control module is configured to determine the negative sequence voltage by:
obtaining a transformation angle; and
transforming the positive synchronous frame voltage command to a negative synchronous reference frame based on the transformation angle.

11. A method for diagnosing stator windings in an electric motor in a vehicle, the method comprising:
generating a voltage command for the stator windings, the voltage command being configured to regulate current through the stator windings to a commanded value;
determining a negative sequence voltage based on the voltage command;
determining a DC component of the negative sequence voltage; and
identifying a fault condition based on a characteristic of the DC component of the negative sequence voltage.

12. The method of claim 11, wherein identifying the fault condition based on the characteristic of the DC component of the negative sequence voltage comprises identifying the fault condition when a magnitude of the DC component of the negative sequence voltage exceeds a threshold value.

13. The method of claim 11, wherein identifying the fault condition based on the characteristic of the DC component of the negative sequence voltage comprises identifying the fault condition when a rate of change of the DC component of the negative sequence voltage exceeds a threshold value.

14. The method of claim 11, further comprising:
obtaining a current command for the electric motor, the current command corresponding to the commanded value; and
measuring currents through the stator windings, resulting in a measured motor currents, wherein generating the voltage command for the stator windings comprises generating the voltage command based on a difference between the current command and the measured motor currents such that the measured motor currents are regulated to the commanded value.

15. The method of claim 11, further comprising
obtaining a synchronous frame current command for the electric motor; and
obtaining a synchronous frame motor current through the stator windings, wherein generating the voltage command for the stator windings comprises generating a synchronous frame voltage command based on a difference between the synchronous frame current command and the synchronous frame motor current such that the synchronous frame motor current is regulated to the synchronous frame current command.

16. A method for diagnosing stator windings in an electric motor operating under control of a current-regulating control loop, the current-regulating control loop being configured to provide a command voltage to the electric motor, the command voltage comprising a current-regulated voltage based on a difference between a commanded current and a measured current through the stator windings, the method comprising:
transforming the command voltage from a positive synchronous reference frame to a negative synchronous reference frame, resulting in a negative synchronous reference frame voltage;
determining a DC component of the negative synchronous reference frame voltage; and
identifying a fault condition when a characteristic of the DC component is greater than a threshold value.

17. The method of claim 16, wherein identifying the fault condition comprises identifying the fault condition when a magnitude of the DC component of the negative synchronous reference frame voltage exceeds a threshold magnitude.

18. The method of claim 16, wherein identifying the fault condition comprises identifying the fault condition when a rate of change of the DC component of the negative synchronous reference frame voltage exceeds a threshold rate of change.

* * * * *